United States Patent [19]

Yonezu et al.

[11] Patent Number: 4,644,500

[45] Date of Patent: Feb. 17, 1987

[54] SEMICONDUCTOR MEMORY DEVICE WITH A CONTROLLED PRECHARGING ARRANGEMENT

[75] Inventors: Ryo Yonezu; Kazuhiro Sakashita, both of Itami, Japan

[73] Assignee: Mitsubishi Denki Kabushiki Kaisha, Tokyo, Japan

[21] Appl. No.: 638,677

[22] Filed: Aug. 8, 1984

[30] Foreign Application Priority Data

Aug. 17, 1983 [JP] Japan .................................. 58-151262

[51] Int. Cl.$^4$ ............................................. G11C 13/00
[52] U.S. Cl. .................................... 365/189; 365/190; 365/203; 365/181
[58] Field of Search ................ 365/190, 202, 203, 181, 365/189

[56] References Cited

U.S. PATENT DOCUMENTS

| 4,300,213 | 11/1981 | Tanimura et al. | 365/190 |
| 4,417,328 | 11/1983 | Ochii | 365/203 |

FOREIGN PATENT DOCUMENTS

| 57-27489 | 2/1982 | Japan | 365/189 |
| 58-1883 | 1/1983 | Japan | 365/227 |

OTHER PUBLICATIONS

Schlageter et al, "A 4K Static 5-V RAM", 1976 IEEE International Solid-State Circuits Conference, pp. 136–137, Feb. 19, 1976.

Primary Examiner—Terrell W. Fears
Attorney, Agent, or Firm—Birch, Stewart, Kolasch and Birch

[57] ABSTRACT

A semiconductor memory device includes: a memory cell constituted by MOSFETs; a bit line for transmitting a writing and a reading information to or from the memory cell therethrough; a writing-in control signal line for controlling the writing operation onto the memory cell; a first conductive type MOSFET with a source thereof being connected to a power supply terminal, with a gate thereof being connected to the writing-in control signal line, and with a drain thereof being connected to the bit line; the first conductive type MOSFET being adapted to charge up the bit line when no writing is performed in the memory cell; a second conductive type MOSFET with first control line thereof being connected to the bit line, with a gate thereof being connected to the writing-in control signal line, and with a second control line thereof being connected to the output terminal of the writing circuit; and the second conductive type MOSFET being adapted to transmit to the bit line an output from the writing circuit.

8 Claims, 2 Drawing Figures

SEMICONDUCTOR MEMORY DEVICE WITH A CONTROLLED PRECHARGING ARRANGEMENT

FIELD OF THE INVENTION

The present invention relates to a semiconductor memory device capable of speeding up the writing operation, and minimizing the consumption of electricity.

BACKGROUND OF THE INVENTION

In order to explain the background of the present invention in detail, reference will be made to FIG. 1, which shows a circuit diagram of a prior art semiconductor memory device. There are provided enhancement type MOS field-eeffect transistors 1,2,3 and 4, hereinafter referred to as MOSFETs. The drains of the P-channel MOSFET 1 and N-channel MOSFET 2 are connected to each other, and the gates thereof are connected to each other. The source of the MOSFET 1 is connected to a power supply terminal 5, and that of the MOSFET 2 is connected to ground, thus constituting a complementary MOS (hereinafter referred to as CMOS) inverter 30a. Likewise, the P-channel MOSFET 3 and the N-channel MOSFET 4 constitute a CMOS inverter 30b. With these two inverters 30a and 30b a bistable circuit, that is, a flip-flop, is formed. More particularly, the outputs of the two inverters 30a and 30b are connected to the inputs of the mating inverters 30b and 30a. In other words, the drains of the P-channel MOSFETs 1 and 3, and of the N-channel MOSFETs 2 and 4 are connected to the gates of the N-channel MOSFETs 4 and 2, and of the P-channel MOSFETs 3 and 1, respectively. In this way a one bit memory cell 30 is constructed.

The N-channel MOSFETs 6 and 7 which are used for transfer gates to control the writing-in and the reading-out operation, have drains (or sources) connected to the drain of the MOSFETs 1 and 2, and that of the MOSFETs 3 and 4, respectively, and have sources (or drains) connected to bit lines 8 and 9 respectively, which function as information lines for writing-in as well as reading-out. The gates of the N-channel MOSFETs 6 and 7 are connected to a word line 10 which functions as a selector line for writing-in as well as reading-out.

The sources and gates of the N-channel MOSFETs 11 and 12 are connected to power supply terminals 5, and their drains are connected to the bit lines 8 and 9. An information input signal line 13 is connected to the gates of the P-channel MOSFET 14 and N-channel MOSFET 15, which constitute a writing-in circuit 40. In addition, the information input signal line 13 is connected to the drain (or source) of the N-channel MOSFET 16, which is used for a gate to control the information to be written in. The source (or drain) of the MOSFET 16 is connected to the bit line 9, and its gate is connected to a writing-in control signal line 17 which is designed to control the writing operation of the memory cell 30. The drains of the MOSFETs 14 and 15 are connected to the drain (or source) of the N-channel MOSFET 18, which is used for a gate to control the data to be written in. The source (or drain) of the N-channel MOSFET 18 is connected to the bit line 8, and its gate is connected to the writing-in control signal line 17. In this way the MOSFETs 16 and 18 can transmit the output from the writing-in circuit 40 to the bit lines 8 and 9 through between the drain and source thereof.

In operation, the memory cells 30 and the MOSFETs 6, 7 are arrayed in matrix in plurality. A desired memory cell is directly selected by the random access method, in or from which memory cell the data is written or read out. While the memory cell stores data, the word line 10 is kept at almost zero voltage, thereby turning off the MOSFETs 6 and 7. The memory cell 30 constituted by the MOSFETs 1, 2, 3 and 4 is electrically separated from the bit lines 8 and 9. The memory cell 30 is in one of two stable states when the gates of the MOSFETs 1 and 2 are kept "L" (low). At this time the MOSFET 1 is in ON state with its drain being kept "H" (high). Accordingly, the gates of the MOSFETs 3 and 4 become "H", thereby turning on the MOSFET 4 with placing its drain "L".

When the memory cell 30 is in this stable state, information can be written therein by applying voltage corresponding to the information to the bit lines 8 and 9, and applying the voltage "H" to the word line 10 so as to address the memory cell 30.

Now, suppose that the logic "1" is to be written in the memory cell 30. The voltage "H" is applied to the writing-in control signal line 17, thereby turning on the MOSFETs 16 and 18, and the voltage "H" corresponding to the logic "1" is applied to the information input signal line 13. In this way the bit line 9 is kept "H" through the MOSFET 16. In addition, the gates of the MOSFETs 14 and 15 are kept "H", thereby turning off the MOSFET 14 and turning on the MOSFET 15. Thus the drains of the MOSFETs 14 and 15 become "L", thereby placing the bit line 8 "L" through the MOSFET 18.

At this stage, when the word line 10 is placed "H", the MOSFETs 6 and 7 are turned on, thereby enabling the potentials in tne bit lines 8 and 9 to be impressed on the memory cell 30. As a result, the MOSFET 1 is turned off whereas the MOSFET 2 is turned on, thereby reversing the states of the MOSFETs 1, 2, and 3, 4. In this way the memory cell 30 enter into the other stable state which means storing the information "1". Subsequently, the word line 10 and the writing-in control signal line 17 are returned to "L". With this, the writing operation ends.

When information is to be read out from the memory cell 30, voltage of the same amplitude as that applied while writing-in operation, is impressed on the word line 10, thereby turning on the MOSFETs 6 and 7. This ensures that the electric charges stored in the bit lines 8 and 9 through the MOSFETs 11 and 12 are absorbed by the information stored in the memory cell 30, whereby a potential difference is given to between the bit lines 8 and 9 in accordance with the information stored in the memory cell 30. In this way the stored information is transmitted to the bit lines 8 and 9, and thereafter it is amplified as by a sense amplifier, and is output to the outside.

When this reading operation is to be performed, it is the common practice to charge up the bit lines 8, 9 previously up to the "H" voltage through the MOSFETs 11, 12. This is important in preventing an erroneous writing of the information in the bit lines onto the memory cell, which is likely to occur when the MOSFETs 6, 7 are turned on in a situation where the bit lines having a large parasitic capacity have information opposite to that stored in the memory cell.

Under the prior art semiconductor memory device mentioned above, the bit lines are constantly charged in spite of the fact that the charging-up is required only when a reading-out operation is to be performed. As a result, the writing information and the electric charges in the bit lines come into collision when information is to be written in. This increases the consumption of electricity, and slows down the operational speeds.

One of prior art methods of controlling the writing and the reading operation is a technique disclosed in the article entitled "A 4K Static 5V RAM" by Jeffrey M. Schlageter, Nagab Jayakumar, Joseph H. Kroeger and Vahe Sarkissian, which was prepared for the 1976 International Solid-State Circuit Conference. The article teaches that by disabling the Chip Enable signal, the bit and data lines are equalized to an intermediate voltage of the power supply voltage.

OBJECTS AND SUMMARY OF THE INVENTION

The present invention is directed to solve the problems pointed out with respect to the prior art semiconductor memory device, and has for its object to provide an improved semiconductor memory device capable of charging up the bit lines by a MOSFET which is under an immediate control by a writing-in control signal line when no writing-in is performed in the memory cell, wherein the charging-up of the bit lines and the outputting of the written information to the bit lines are controlled so as not to occur at one time or overlap timingly, thereby ensuring that no collision occurs at the time of writing between the writing information and the charging voltage. Thus the operational speed is increased, and the consumption of electricity is minimized.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to one aspect of the present invention, there is provided a semiconductor memory device which comprises: a memory cell constituted by MOSFETs; a bit line for transmitting a writing and a reading information to or from the memory cell therethrough; a writing-in control signal line for controlling the writing operation onto the memory cell; a first conductive type MOSFET with the source thereof being connected to a power supply terminal, with the gate thereof being connected to the writing-in control signal line, and with the drain thereof being connected to the bit line; the first conductive type MOSFET being adapted to charge up the bit line when no writing is performed in the memory cell; and a second conductive type MOSFET with the drain (or source) thereof being connected to the bit line, with the gate thereof being connected to the writing-in control signal line, and with the source (or drain) thereof being connected to the output terminal of the writing circuit; and the second conductive type MOSFET being adapted to transmit to the bit line an output from the writing circuit.

DETAILED DESCRIPTION OF THE INVENTION

Figure 1:
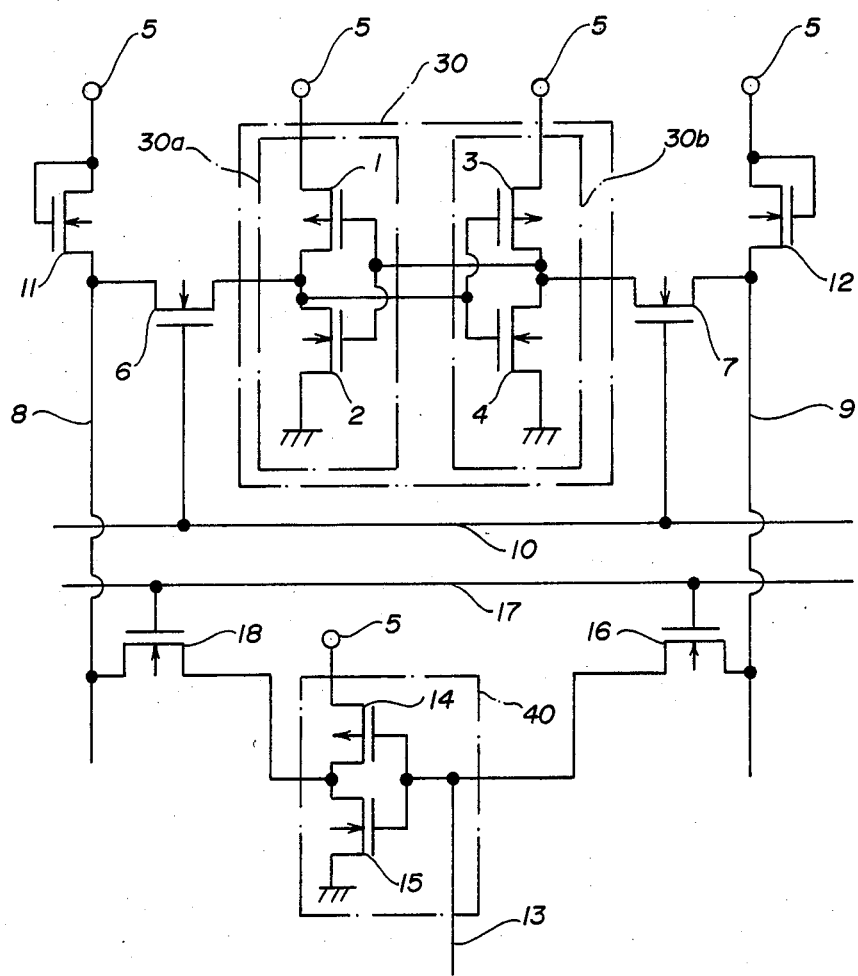
FIG. 1 is a circuit diagram of a main part of a prior art semiconductor memory device.
Figure 2:
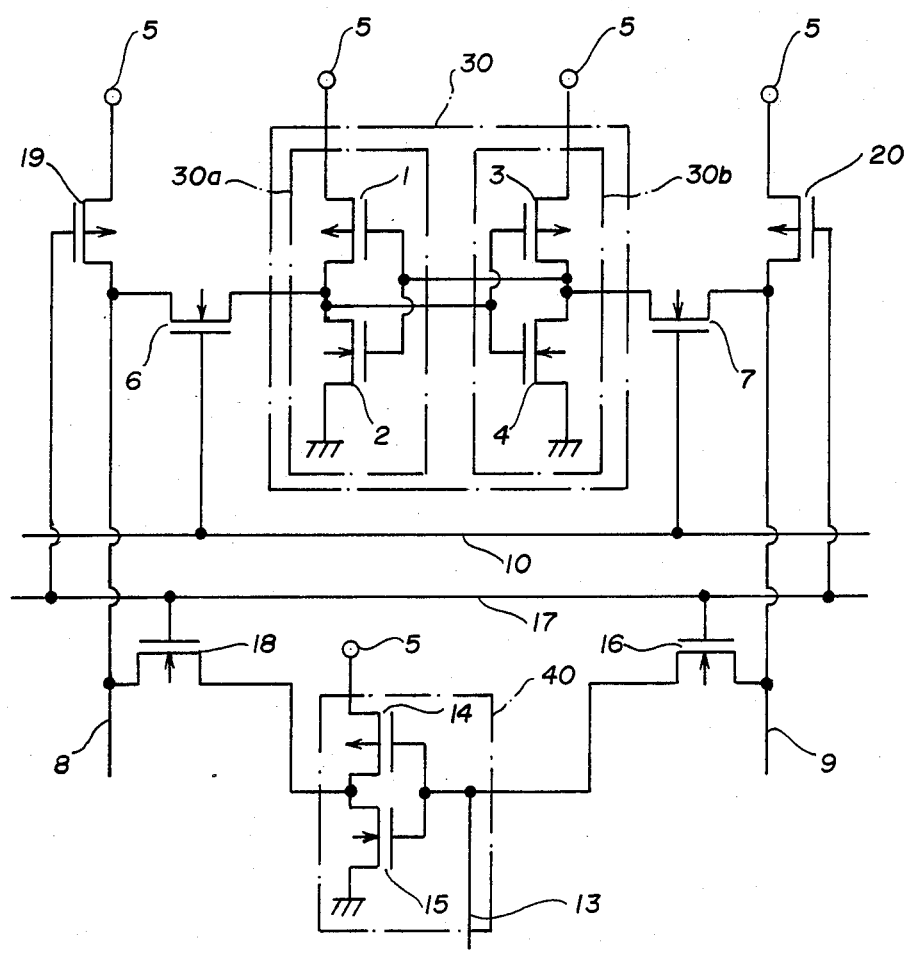
FIG. 2 is a circuit diagram of that part of the semiconductor memory device embodying the present invention which corresponds to the part shown in FIG. 1.

Referring to FIG. 2, wherein like reference numerals to those in FIG. 1 refer to like and corresponding elements, bit lines 8 and 9 are connected to P-channel (first conductive type) MOSFETs 19 and 20, whereby the bit lines are charged up. Each source of the MOSFETs 19 and 20 is connected to the power supply terminal 5, and the drains thereof are respectively connected to the bit lines 8 and 9. The gates thereof are connected in common to a writing-in control signal line 17. The MOSFETs 19 and 20 are turned on by a signal potential in the writing-in control signal line 17 only when no writing is performed in the memory cell 30, thereby charging up the bit lines 8 and 9 through between their source and drain.

In this place, there are provided N-channel (second conductive type) MOSFETs 16 and 18 which are adapted to transmit the writing information and the inverted signal thereof output from the writing circuit 40 to the bit lines 9 and 8, respectively, in the same manner as in FIG. 1.

In operation, now suppose that the voltage of the word line 10 is "L", thereby turning off the MOSFETs 6 and 7, and electrically separating the MOSFETs 1, 2, 3 and 4 from the bit lines 8 and 9, and that the memory cell 30 is in a stable state where the drains of the MOSFETs 1 and 2 are "H" whereas those of the MOSFETs 3 and 4 are "L".

At this stage, when the information "1" is to be written in the memory cell 30, the voltage "H" corresponding to the "1" is applied to the information input signal line 13, and the writing-in control signal line 17 is placed "H". At this time the MOSFETs 19 and are turned off, and the MOSFETs 16 and 18 are turned on. Since the MOSFET 14 is turned off and the MOSFET 15 is turned on by the voltage "H" applied to the information input signal line 13, voltage "L" is applied to the bit line 8. The voltage of the information input signal line 13 is applied to the bit line 9, which becomes "H".

In order to complete the writing operation, the voltage "H" is impressed on the word line 10, thereby turning on the MOSFETs 6 and 7. As a result, the gates of the MOSFETs 1 and 2 become "H", and the gates of the MOSFETs 3 and 4 become "L", which leads to the completion of the writing-in of the information "1" in the memory cell 30. The writing operation ends up with restoring the word line 10 to the state "L", and the writing-in control signal line 17 to the state "L".

When the stored information is to be read out, the voltage "L" and "L" are impressed on the writing-in control signal line 17 and the word line 10, respectively. As a result, the MOSFETs 19 and 20 are turned on, and the bit lines 8 and 9 are charged up with the power supply voltage. At this stage, the word line 10 is placed at "H", thereby turning on the MOSFETs 6 and 7, and the electric charges of the bit lines 8 and 9 are absorbed in accordance with the information stored in the memory cell 30. In this way, the bit lines 8 and 9 come to have a potential difference therebetween in accordance with the information stored in the memory cell 30. The information transmitted to the bit lines 8 and 9 is amplified as by a sense amplifier, and is output to the outside.

In the foregoing description a general purpose random read/write memory device has been referred to as an example, but the present invention is not limited to it. The present invention is readily embodied in a largescale integration of a CMOS type gate array which has a sense amplifier and a writing circuit in each column having a fixed pattern. In this case the speeding-up of the operation and the reducing of electricity consumption are particularly enhanced.

According to the present invention, the bit lines are charged up by the MOSFET which is under an immediate control by the writing-in control signal line, wherein the charging-up is performed only when no writing is operated in the memory cell. A further advantage of the present invention is that no overlapping occurs between the charging-up of the bit lines and the outputting of the written information to the bit lines, from the writing portion of the circuit which means that no collision occurs between the charging voltage and the writing information. This ensures that the writing operation speeds up and the consumption of electricity is minimized.

What is claimed is:

1. A semiconductor memory device which comprises:
    a memory cell constituted by MOSFETS;
    a bit line for transmitting writing and reading information to or from the memory cell therethrough;
    a writing-in control signal line for controlling the writing operation into the memory cell in response to a write-in signal;
    a first conductive type MOSFET with a source thereof being connected to a power supply terminal, a gate thereof being connected to the writing-in control signal line, and a drain thereof being connected to the bit line;
    the first conductive type MOSFET being responsive to the write-in signal and charging the bit line when said signal indicates that no writing is to be performed in the memory cell;
    writing means for writing data into said memory cell in response to the presence of a signal on said writing-in control line indicating that writing is to be performed, said writing means having an output terminal with the data to be written into said cell present thereon;
    a second conductive type MOSFET having a first controlled terminal thereof being connected to the bit line, a gate thereof being connected to the writing-in control signal line, and having a second controlled terminal thereof being connected to the output terminal of the writing circuit for writing information to the memory cell; and the second conductive type MOSFET transmitting the output of said writing means to said bit line.

2. A semiconductor memory device with the ability to write data into storage and read data out of storage comprising:
    memory cell, said memory cell having an input/output line for inputting data to and outputting data from said memory cell;
    data bit transfer means for transmitting data to and from said memory cell;
    a first MOSFET of a first conductive type with first and second control terminals thereof connected to said input/output line and having said second control terminal connected to said data bit transfer means;
    a word line, connected to a gate of said first MOSFET of a first conductive type, for turning ON said first MOSFET of a first conductive type only when a writing-in or reading-out operation is to be carried out using said memory cell;
    writing-in signal line for controlling a writing-in operation into said memory cell;
    a first MOSFET of a second conductive type, with a drain thereof connected to said data bit transfer means, with a gate thereof connected to said writing-in signal line and with a source thereof connected to a power supply terminal, for charging said data bit transfer means, said first MOSFET of a second conductive type being turned OFF and thereby stopping the charging of said data bit line when a writing-in signal is present on said writing-in signal line such that a writing-in operation is to be conducted.

3. The semiconductor memory device of claim 2 further comprising:
    writing means for writing data into said memory cell in response to the presence of a writing-in signal on said writing-in signal line.

4. The semiconductor memory device of claim 3 wherein said writing means comprises an inverter and a second MOSFET of the first conductive type with first and second control terminals and a gate, said second MOSFET of the first conductive type having said first control terminal connected to said inverter, its gate connected to said writing-in signal line and said second control terminal connected to said data bit transfer means, said second MOSFET of the first conductive type acting as a switch such that it is ON, thereby allowing data flow between said inverter and said data bit transfer means only when a write-in signal is present on said write-in signal line.

5. A semiconductor device with the ability to write data into storage and read data out of storage comprising:
    memory cell, said memory cell having a plurality of input/output lines, each of said input/output lines for inputting data into and output data from said memory cell;
    a plurality of data bit lines for transmitting data to and from said memory cell, said plurality of data bit lines corresponding to said input/output lines in a one-to-one manner;
    a plurality of MOSFETs of a first conductive type having a first and second control terminal and a gate, with the number of said MOSFETS of a first conductive type corresponding to said input/output lines in a one-to-one manner with each MOSFET being arranged so that said first control terminal is connected to one of said input/output lines and its said second control terminal is connected to one of said data bit lines;
    a word line, connected to the gate of each of said plurality of MOSFETs of a first conductive type, for turning ON said MOSFETs only when a writing-in or reading out operation is to be carried out using said memory cell;
    writing-in signal line for controlling a writing in operation into said memory cell;
    a plurality of MOSFETs of a second conductive type having a first and second control terminal and a gate, corresponding to said date bit lines in a one-to-one manner with each MOSFET of a second conductive type being arranged so that said first control terminal thereof is connected to a power supply terminal, the gate thereof being connected to said writing-in signal line and said second control terminal thereof being connected to one of said data bit lines for charging said one of said data bit lines, said each of said MOSFETs of a second conductive type being turned OFF, thereby stopping the charging of said data bit lines, when a writing-in signal is present on said writing-in signal line such that a writing-in operation is to be conducted.

6. The semiconductor memory device of claim 5 further comprising
a writing means for writing data into said memory cell in response to the presence of a writing-in signal on said writing-in signal line.

7. The semiconductor memory device of claim 6 wherein said writing means comprises:
inverter; and
a second plurality of MOSFETs of a first conductive type having a first and second control terminal and a gate, corresponding to said data bit lines in a one-to-one manner so that each of said second plurality of MOSFETs of a first conductive type has said first control terminal thereof connected to said inverter, said second control terminal thereof connected to one of said data bit lines and the gate thereof connected to said writing-in signal line, said each one of said second plurality of MOSFETs of a first conductive type acting as a switch that is ON, thereby allowing data to flow between said inverter and said one of said data bit lines only when a write-in signal is present on said write-in signal line.

8. The semiconductor memory device of claim 5 where the number of input/output lines of said memory cell equal to two.

* * * * *